United States Patent
PK et al.

(10) Patent No.: US 11,728,667 B2
(45) Date of Patent: *Aug. 15, 2023

(54) METHOD AND APPARATUS FOR DEEPLY DISCHARGED BATTERY DETECTION

(71) Applicant: SLING MEDIA PVT LTD, Bangaluru (IN)

(72) Inventors: Arun PK, Bangaluru (IN); Yashwanth Melwanki, Bangaluru (IN)

(73) Assignee: DISH Network Technologies India Private Limited

( * ) Notice: Subject to any disclaimer, the term of this patent is extended or adjusted under 35 U.S.C. 154(b) by 0 days.

This patent is subject to a terminal disclaimer.

(21) Appl. No.: 17/865,259

(22) Filed: Jul. 14, 2022

(65) Prior Publication Data
US 2022/0352739 A1  Nov. 3, 2022

Related U.S. Application Data

(63) Continuation of application No. 16/928,494, filed on Jul. 14, 2020, now Pat. No. 11,394,224.

(30) Foreign Application Priority Data

Jul. 30, 2019 (IN) .............................. 201941030756

(51) Int. Cl.
| | |
|---|---|
| *H02J 7/00* | (2006.01) |
| *G01R 31/3835* | (2019.01) |
| *G01R 31/367* | (2019.01) |
| *G01R 31/371* | (2019.01) |

(52) U.S. Cl.
CPC ...... *H02J 7/007182* (2020.01); *G01R 31/367* (2019.01); *G01R 31/371* (2019.01); *G01R 31/3835* (2019.01); *H02J 7/0031* (2013.01); *H02J 7/0047* (2013.01); *H02J 7/0063* (2013.01)

(58) Field of Classification Search
CPC .. H02J 7/007182; H02J 7/0031; H02J 7/0047; H02J 7/0063; G01R 31/3835; G01R 31/367; G01R 31/371
USPC ........................................................ 320/136
See application file for complete search history.

(56) References Cited

U.S. PATENT DOCUMENTS

| | | | |
|---|---|---|---|
| 11,524,602 B2* | 12/2022 | Kuwabara ............. | H02J 7/0063 |
| 2013/0207618 A1* | 8/2013 | Renken ............... | H01M 10/425 |
| | | | 320/155 |
| 2017/0139012 A1* | 5/2017 | Smith ................ | G01R 31/3646 |

* cited by examiner

*Primary Examiner* — Nathaniel R Pelton
(74) *Attorney, Agent, or Firm* — KW Law, LLP

(57) ABSTRACT

Systems and processes are provided to detect a deeply discharged rechargeable battery. A process includes initiating a processor operative to perform a function within a battery-operated device, determining a first output voltage of a battery, charging the battery with a battery charger for a duration of time between three and seven seconds in response to the first output voltage being less than a cutoff voltage, rebooting the battery-operated device, determining a second output voltage of the battery, providing a user prompt indicative of battery fault in response to the second output voltage being less than the cutoff voltage, and shutting down the battery-operated device.

19 Claims, 5 Drawing Sheets

METHOD AND APPARATUS FOR DEEPLY DISCHARGED BATTERY DETECTION

PRIORITY CLAIM

This application is a continuation of U.S. patent application Ser. No. 16/928,494 filed on Jul. 14, 2020, which claims the benefit of India Provisional Patent Application No. 201941030756 filed on Jul. 30, 2019, which is incorporated herein by reference.

TECHNICAL FIELD

The following discussion generally relates to the charging and classification of batteries. More particularly, the following discussion relates to determining a usability of a battery in a rechargeable electronic device in light of a potential deep discharge of the battery.

BACKGROUND

In recent years, portable electronic devices have become more and more ubiquitous. Portable electronic devices such as mobile phones, digital cameras, portable video games and other electronic entertainment devices are often powered by rechargeable batteries. Lithium Ion batteries are a type of rechargeable battery common in portable electronic devices, portable tools, and electric vehicles. Lithium ion batteries use an intercalated lithium compound as one electrode material and have a high energy density, no memory effect and low self-discharge.

Modern rechargeable batteries typically have a cutoff voltage at which the battery stops supplying voltage to the electronic device and is the voltage at which the battery is considered fully discharged. This cutoff voltage is operative to prevent damage to the electronic device and to the battery. However, due to some parasitic resistances and internal battery operations, further discharge may occur over longer periods of time causing permanent damage to the battery and potentially unsafe conditions for further battery service, such as bulging due to chemical instability or excessive heating, fire, or explosion due to internal short circuits.

It is therefore desirable to create systems and methods that are able to determine that a battery has been deeply discharged to a potentially unsafe level and to indicate to a user deep discharge status of the battery. Other desirable features and characteristics will become apparent from the subsequent detailed description and the appended claims, taken in conjunction with the accompanying drawings and this background section.

BRIEF SUMMARY

Disclosed herein are human machine interface methods and systems and related circuitry for provisioning computational systems, methods for making and methods for operating such systems, and system equipped with onboard control systems. By way of example, and not limitation, presented are various embodiments of detection of a deeply discharged rechargeable battery are disclosed herein.

In accordance with an aspect of the disclosure a method including initiating a processor operative to perform a function within a battery-operated device, determining a first output voltage of a battery, charging the battery with a battery charger for a duration of time between three and seven seconds in response to the first output voltage being less than a cutoff voltage, rebooting the battery-operated device, determining a second output voltage of the battery, providing a user prompt indicative of battery fault in response to the second output voltage being less than the cutoff voltage, and shutting down the battery-operated device.

In accordance with another aspect of the disclosure further including determining a third output voltage of the battery and wherein the shutting down of the battery-operated device is performed in response to the third output voltage being less than a cutoff voltage.

In accordance with another aspect of the disclosure wherein the cutoff voltage is zero volts and is indicative of the battery being disconnected by a cutoff circuitry in response to the battery being discharged below a lower voltage limit.

In accordance with another aspect of the disclosure wherein the user prompt is provided via a light emitting diode.

In accordance with another aspect of the disclosure wherein the battery is a lithium ion battery.

In accordance with another aspect of the disclosure wherein the cutoff voltage is indicative of the battery being discharged below a lower voltage limit.

In accordance with another aspect of the disclosure further including incrementing a counter in response to the first output voltage being less than a cutoff voltage.

In accordance with another aspect of the disclosure wherein the user prompt is provided via an audible alert.

In accordance with another aspect of the disclosure a battery-operated device including a battery having a voltage output and wherein the battery is operative to disconnect the voltage output in response to a charge level being below a lower voltage limit, a charging circuit for charging the battery in response to a charging control signal, a processor for determining a first determination of the voltage out of the battery, generating a charging control signal to control the charging circuit to charge the battery for a duration of time between three and seven seconds in response to the first determination being less than the lower voltage limit, for rebooting the battery-operated device, for determining a second determination of the voltage out of the battery, for generating a user prompt indicative of battery fault in response to the second determination being less than the lower voltage limit, and for shutting down the battery-operated device.

In accordance with another aspect of the disclosure further including a user interface for displaying the user prompt.

In accordance with another aspect of the disclosure further including a user interface for providing an audible alert in response to the user prompt.

In accordance with another aspect of the disclosure wherein the battery is a lithium ion battery.

In accordance with another aspect of the disclosure wherein the user prompt is a signal for illuminating a light emitting diode.

In accordance with another aspect of the disclosure wherein the processor is further operative to increment a counter in response to the first determination being less than the lower voltage limit.

In accordance with another aspect of the disclosure wherein the first determination is zero volts and is indicative of the battery disconnecting the voltage output in response to a charge level being below a lower voltage limit.

In accordance with another aspect of the disclosure further including a power supply for providing a supply voltage to the charging circuit, the processor, and a user interface.

In accordance with another aspect of the disclosure an apparatus for detecting a deeply discharged battery including a sensor for detecting a first battery output level at a first time, a second battery output level at a second time and a third battery output level at a third time, a charging circuit for charging the battery in response to a control signal, a user interface for providing a user alert in response to an alert notification, a processor operative to compare the first battery output level to a lower voltage limit, to increment a counter and to generate the control signal to control the charging circuit to charge the battery for a first duration of time between four seconds and six seconds in response to the first battery output level being less than the lower voltage limit, the processor being further operative to compare the second battery output level to the lower voltage limit, to increment the counter and to generate the control signal to control the charging circuit to charge the battery for a second duration of time between four seconds and six seconds in response to the second battery output level being less than the lower voltage limit, the processor being further operative to compare the third battery output level to the lower voltage limit, to increment the counter and to generate the alert notification in response to the counter exceeding a count limit and to shutdown the apparatus in response to the counter exceeding the count limit.

In accordance with another aspect of the disclosure wherein the processor is operative to reboot the apparatus after the battery is charged for the first duration of time, the processor being further operative to reboot the apparatus after the battery is charged for the second duration of time.

In accordance with another aspect of the disclosure wherein the battery is a lithium ion battery and the lower voltage limit is a cutoff voltage of the lithium ion battery.

In accordance with another aspect of the disclosure wherein the user interface is a plurality of light emitting diodes and the user alert is displayed by illuminating a combination of the light emitting diodes.

The above advantage and other advantages and features of the present disclosure will be apparent from the following detailed description of the preferred embodiments when taken in connection with the accompanying drawings.

BRIEF DESCRIPTION OF THE DRAWING FIGURES

The exemplary embodiments will hereinafter be described in conjunction with the following drawing figures, wherein like numerals denote like elements, and wherein.

The exemplifications set out herein illustrate preferred embodiments of the disclosure, and such exemplifications are not to be construed as limiting the scope of the disclosure in any manner.

DETAILED DESCRIPTION

The following detailed description is intended to provide various examples, but it is not intended to limit the disclosure or the application and uses of the disclosure. Furthermore, there is no intention to be bound by any theory presented in the preceding background or the following detailed description.

As noted above, various embodiments are able to detect a deeply discharged rechargeable battery in a battery powered electronic device. As described more fully below, a battery within a battery powered electronic device, such as a mobile phone, digital camera, or the like may have a cutoff voltage, such as 3 volts, under which the battery may deliberately cutoff supplying voltage to the electronic device in order to avoid damage to the device or the battery. However, due to various parasitic voltage discharge mechanisms, a battery discharged to the cutoff voltage and then stored for a lengthy period of time may further discharge to unsafe voltage levels, such as 1.8 volts where damage to the battery may occur and recharging may present a potential fire hazard. Various embodiments may be augmented or modified as desired, and many equivalent embodiments are described herein.

The general concepts described herein may be implemented in any rechargeable electronic device. For convenience of illustration, the following discussion often refers to a wireless video transmission device operative to receive video from a video producing device, such as a digital camera via a video cable, such as an HDMI cable and to convert a format of the video and to transmit the video via a wireless network. The actions taken in response to the detection of a deeply discharged rechargeable battery can be associated with the functionality of the mobile phones, portable electronic entertainment devices, and any other rechargeable electronic device. Additional details and examples are provided in the following description.

Figure 1:
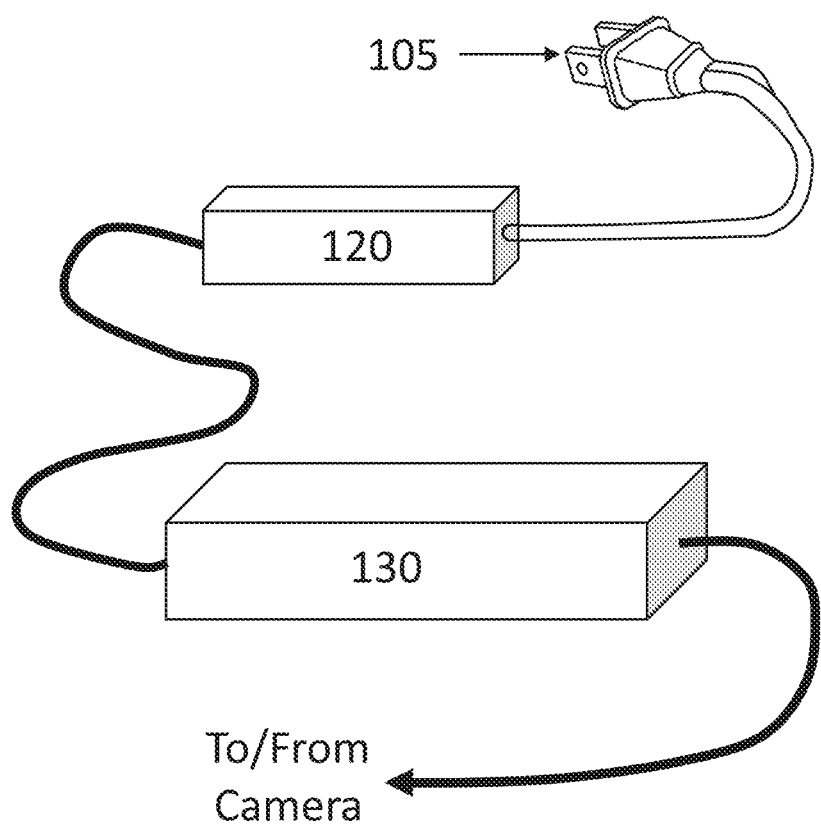
FIG. 1 shows an application 100 for detection of a deeply discharged rechargeable battery in an electronic device according to an exemplary embodiment of the present disclosure.

Turning now to FIG. 1, an environment for a system 100 for detection of a deeply discharged rechargeable battery in an electronic device according to an exemplary embodiment of the present disclosure is shown. The exemplary system may include a device 130 with an integral rechargeable battery and charging circuitry, a power supply 120 with a connected standard 120 volt wall plug 105. The power supply 120 may also be supplied with a 240 volt supply or an combination thereof.

In this exemplary embodiment, the device 130 is operative to receive data from a camera and to convert this data to a format suitable for transmission via a wireless network, such as a Wi-Fi network. The exemplary device 130 includes a Lithium Ion battery which is charged when connected to the power supply 120. The power supply 120 may further be operative to power the device 130 while the power supply 120 is connected and the battery is being charged. The Lithium Ion battery is operative to power the device 130 when the power supply 120 is disconnected from the device 130 facilitating continued video streaming from the camera in a portable manner.

During bootup, the device 130 is operative to monitor the output voltage of the battery. If no voltage is detected, is can be assumed that the battery voltage is below the cutoff voltage, for example 3 volts, and the battery output has been disconnected from the battery. To determine if the battery voltage has discharged below a safe level for continued use of the battery, such as 1.8 volts, the device 130 is operative to allow the battery to be charged for a short period of time, such as 5 second. After the short period of time has elapsed, the device 130 is then operative to reboot the device 130 operating software. Once the device 130 is rebooted, the device 130 again measures the output of the battery. If no output is detected from the battery, the device 130 again operative to charge the battery the short period of time and to again reboot the device 130. This process is repeated for a predetermined number of cycles, such as 5 cycles. If after the predetermined number of cycles, the battery output voltage has not risen above the cutoff voltage, the device 130 may conclude that the battery has been discharged below a safe voltage and therefore should not be used or recharged. The device 130 may then be operative to generate a user notification, such as an LED pattern, indicator on a user screen, or audible alert. The device 130 may then be operative to power down in response to the unsafe battery condition. In an alternate embodiment, the device 130 may be operative to continue to run on voltage supplied by the power supply 120 but may disengage the battery from the charging circuit.

Figure 2:
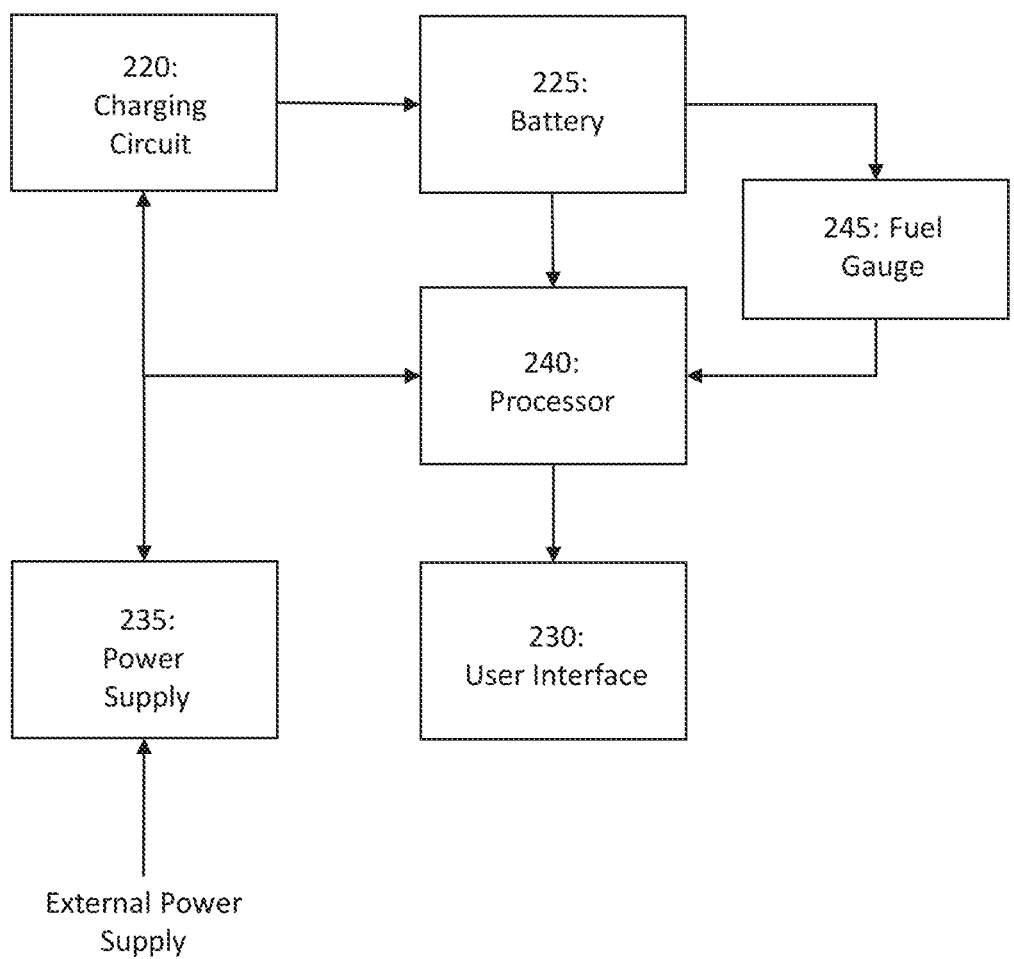
FIG. 2 shows a system 200 for detection of a deeply discharged rechargeable battery in an electronic device according to an exemplary embodiment of the present disclosure.

Turning now to FIG. 2, a system 200 for detection of a deeply discharged rechargeable battery in an electronic device according to an exemplary embodiment of the present disclosure is shown. The system 200 may include a charging circuit 220, a battery 225, a power supply 235, a processor 240, and a user interface 230. The power supply 235 is operative to power the processor 240, the user interface 230, and the charging circuitry 220 in response to a voltage received from the battery 235 or from an external power supply, such as an external 5 volt power supply. The power supply 235 may be operative to generate an appropriate voltage to couple to the processor 240 in order to commence operation of the system 200. The power supply 235, in response to a control signal from the processor 240 and from a voltage supplied from an external power supply, is further operative to energize the charging circuit 220 in order to charge the battery 225. According to design criteria, battery charging may be performed during operation of the processor 240.

The charging circuit 220 is operative to receive a voltage from the power supply 235 and to convert this voltage to an appropriate voltage and current to recharge the battery 225. The charging circuit 220 may be operative to monitor the output voltage of the battery 225 in order to determine if the battery 235 should be recharged. For example, a battery output of 4.3 volts may be considered fully charged and the charging circuit 220, in response to detecting a battery output of 4.3 volts may stop a recharging voltage application. Upon detecting a subsequent battery output of a predetermined charging voltage, for example of 3.7 volts, the charging circuit 220 may again continue the recharging voltage application until the battery 225 is recharged to the fully charged level. In this exemplary embodiment, the charging circuit 220 may further be operative to detect the lack of a voltage output from the battery 225, indicative of a battery discharged below the cutoff voltage. The charging circuit 220 may then generate a control signal or the like to couple to the processor 240 indicative of the cutoff battery output.

In an alternate embodiment, a fuel gauge device 245 which is operative to determine a state of charge of the battery 225. The fuel gauge device may be implemented as a discrete device, a circuit, an integrated circuit, or as a component of the charging circuit 220. If the battery output is cutoff, and therefore having a battery output of zero volts, the fuel gauge device 245 may be operative to generate a error signal for coupling to the processor indicative of the battery output error. In this example, the battery output error may be indicative of a battery output below the cutoff voltage and interpreted by the processor 240 as such. In a particular example, the fuel gauge device 245 may be operative to generate an I2C error for coupling to the processor.

The battery 225 may be a rechargeable lithium ion battery or the like and is operative to power the processor 240 and the user interface 230 in the absence of a connection of an external power supply. In an alternative embodiment, the battery 225 may be operative to power the processor 240 and the user interface 230 when the external power supply is connected and the charging circuit 220 is operative to apply a recharging voltage to the battery 225. The battery 225 may be further operative to monitor the charge level of the battery 225 and to discontinue coupling voltage to other components in the system 200 in response to the charge level falling below a cutoff voltage. This decoupling of the output voltage is performed in order to prevent a further discharge of the battery 225 resulting in damage to the battery 225 or other components in the system 200.

The processor 240 is operative to receive an operating voltage from the power supply 235 and may be operative to perform functions and algorithms associated with the operation of the system 200. In addition, the processor 240 is operative to monitor the output of the battery 225, either directly or via the charging circuit 220, to determine if the battery output voltage is below the cutoff voltage. If the battery output is below the cutoff voltage, for example zero volts, the battery 225 may be discharged to an unsafe discharge level. In detecting that the battery voltage is below the cutoff voltage, the processor 240 may be operative to control the charging circuit 220 to charge the battery 225 for a short period of time, such as five seconds. The processor 240 is then operative to increment a counter and to reboot the system. If upon rebooting the system, if the battery voltage remains cutoff, the processor 240 again operative to control the charging circuit 220 to charge the battery 225 for the short period of time, increment the counter, and reboot the system 200. Once the counter reaches a predetermined number and the battery charge has not risen about the cutoff voltage, the processor 240 is operative to disconnect the battery 225 from the charging circuit 220 and to generate a user prompt indicative of the battery condition and to couple this user prompt to the user interface 230. The processor 240 may then be operative to halt the system 200. In this example, the system halt may be a state in which the battery is decoupled from the charging circuitry, charging is halted, and the system remains powered in response to the external power supply. The processor 240 be operative to halt operation of the device and generate the user prompt for display on the user interface 230 and to retain power to the user interface 230.

The user interface 230 may be a series of LED lights, a display screen, an audio output or the like. The user interface 230 is operative to receive a user prompt from the processor 240 and generates an indication in response to the user prompt. For example, in the instance where the user prompt is indicative of a battery fault, the user interface 230 is operative to generate an indication indicative of the battery fault. This indication may be illumination of an LED or a pattern of LEDs, may be generation of an audible beep, pattern of beeps, or another audible alarm. The indication may be a code, icon, or message on a display screen.

Figure 3:
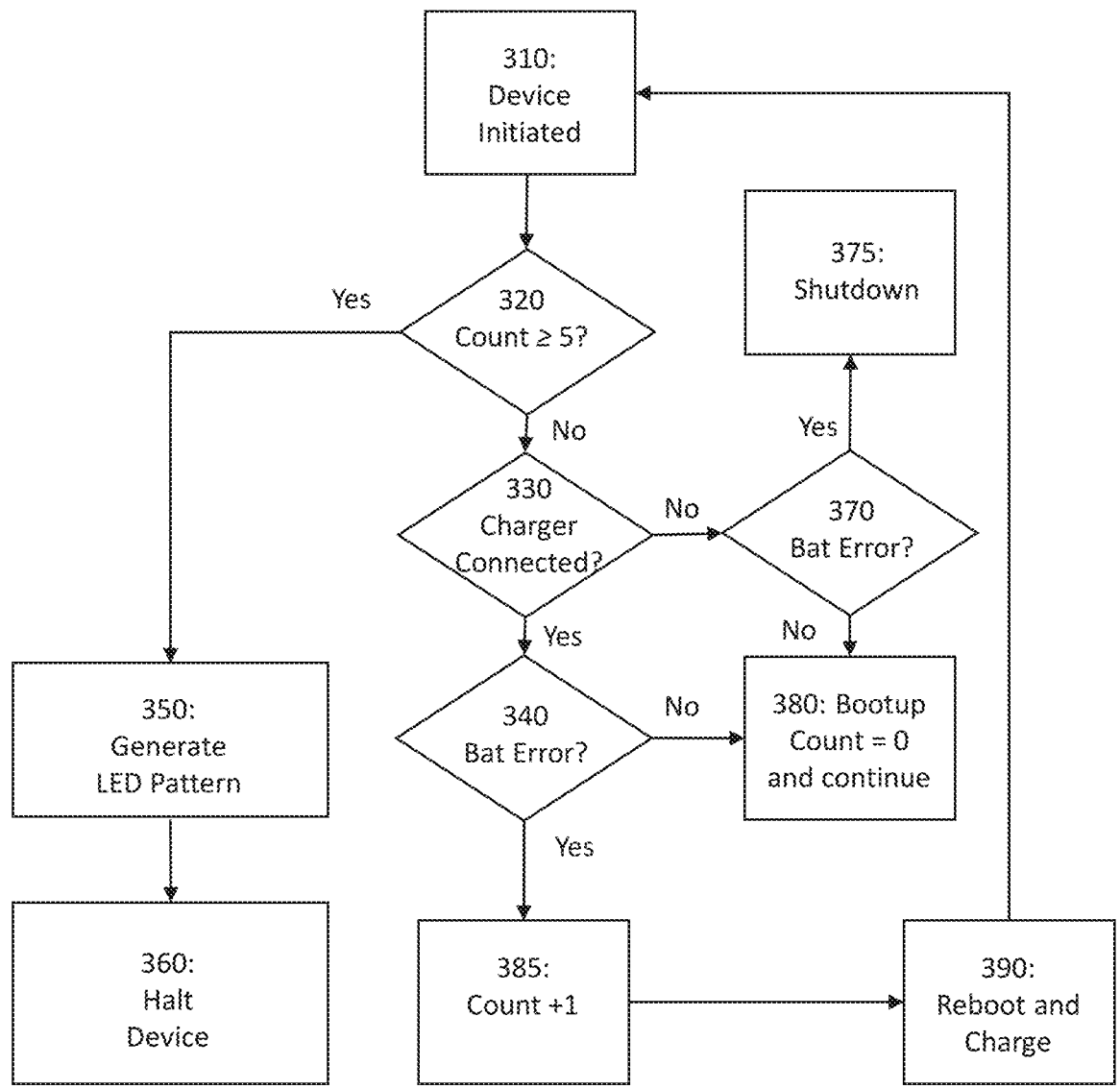
FIG. 3 shows a method 300 for detection of a deeply discharged rechargeable battery in an electronic device according to an exemplary embodiment of the present disclosure.

Turning now to FIG. 3, a method 300 for detection of a deeply discharged rechargeable battery in an electronic device according to an exemplary embodiment of the present disclosure is shown. The method is first operative to initiate 310 the device wherein the device includes a rechargeable battery. During initiation, the method is operative to check 320 a bootup counter to determine if the counter exceeds a predetermined value. In this exemplary embodiment, the counter may be indicative of a number of attempts to charge a rechargeable battery and to reboot the electronic device in response to a battery charge being below a cutoff voltage.

If the count exceeds the predetermined value, the method is then operative to generate 350 a user indication of the battery fault, such as an LED pattern on the electronic device, or the charging circuitry, and to shutdown the device 360. If the count does not exceed the predetermined value 320, the method is then operative to determine 330 if an external power charger is connected to the device. The method may be operative to determine if an external charge is connected by monitoring a voltage at an input of a charging circuit, a power supply, or the like. If no external charger is connected, the method is next operative to determine 370 if there is a battery error indicative of a low voltage output of a battery indicative of a battery charge below a cutoff value. If a battery error exists, the system is not receiving a sufficient supply voltage from either an external power charger or the battery and therefore the system is operative to shutdown 375. If no battery error is determined 370, indicative of a battery output above a cutoff value, the method is operative to reset 380 the bootup counter to zero and to continue normal operation of the electronic device.

If an external power charger is detected 330, the method is next operative to detect 340 if there is a battery error indicative of a low voltage output of a battery indicative of a battery charge below a cutoff value. If no battery error is detected 340, the method is then operative to reset 380 the bootup counter to zero and to continue normal operation of the electronic device. If a battery error is detected 340, the method is then operative to increment 385 the bootup counter and to complete 390 a reboot of the device and to charge the battery for a duration of time, such as five seconds. The method is then operative to return to the device initiation 310.

Figure 4:
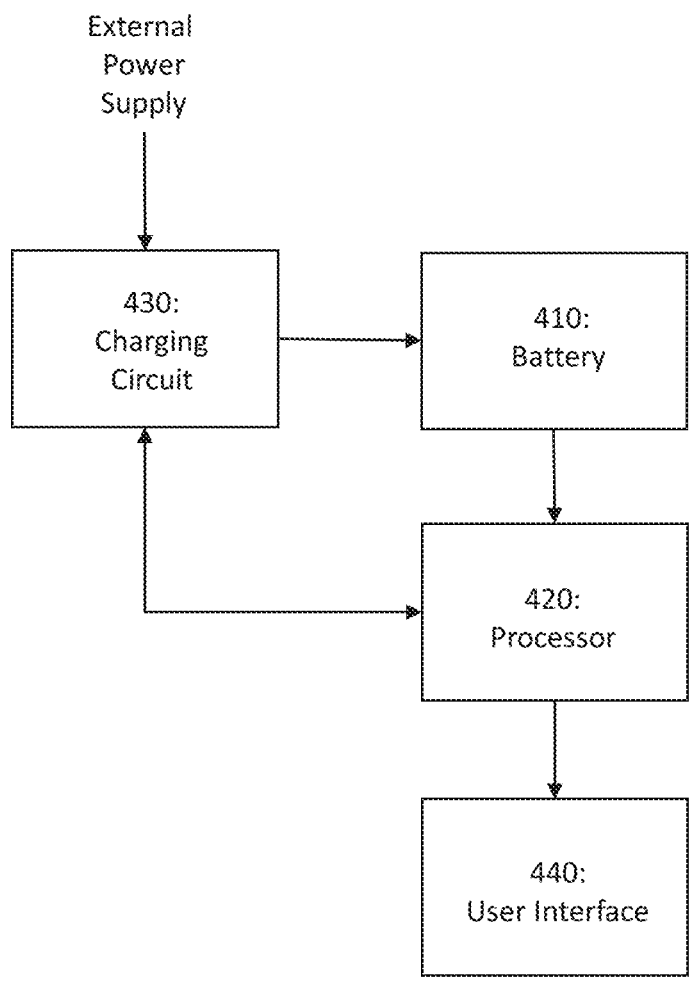
FIG. 4 shows another system 400 for detection of a deeply discharged rechargeable battery in an electronic device according to another exemplary embodiment of the present disclosure.

Turning now to FIG. 4, another system 400 for detection of a deeply discharged rechargeable battery in an electronic device according to an exemplary embodiment of the present disclosure is shown. The system 400 may be a battery-operated device or the like and may include a battery 410, a processor 420, a charging circuit 430 and a user interface 440.

In this exemplary embodiment, the battery 410 is a rechargeable battery and may be a lithium ion battery. The battery has a voltage output and the battery may operative to disconnect the voltage output in response to a charge level being below a lower voltage limit. The lower voltage limit may be a voltage, such as 3.3 volts wherein the battery is considered discharged and where any additional discharge may cause damage to the battery 410 or other components of the system 400. When the lower voltage limit is reached, and the battery is operative to disconnect the voltage output, the voltage output will be zero volts while the battery charge level may be 3.3 volts.

The charging circuit 430 is operative to charge the battery in response to a charging control signal generated by the processor 420. The charging circuit 430 may receive electrical power from an external power supply, such as a five volt power supply. The external power supply is detachable to permit the device to be portable.

The system 400 may further include a processor 420 for determining a first determination of the voltage out of the battery 410. The processor 420 is further operative for generating a charging control signal to control the charging circuit 430 to charge the battery for a duration of time between three and seven seconds in response to the first determination being less than the lower voltage limit. The lower voltage limit is the voltage at which the battery disconnects the battery output in response to the charge level being below a predetermined voltage. The first determination may be zero volts if the battery output has been disconnected from the charging circuit 430. The battery charging duration may be any amount of time determined in response to design criteria, battery capacity, and or/power supply rating and is not limited to the range of three to seven seconds.

The processor 420 is further operative to reboot the battery-operated device after the battery 410 has been charged for the duration of time. The processor is operative to repeat this measuring, charging and reboot process for a predetermined number of cycles. After the predetermined number of cycles have been performed and the battery voltage remains less than the lower voltage limit, the processor 420 is further operative for generating a user prompt indicative of battery fault and for shutting down the battery-operated device.

The user interface 440 may include a display for displaying the user prompt or may be a speaker operative to provide an audible alert in response to the user prompt. In response to the user prompt generated by the processor 420, the user interface 440 may be operative to illuminate a light emitting diode indicative of the battery fault.

Figure 5:
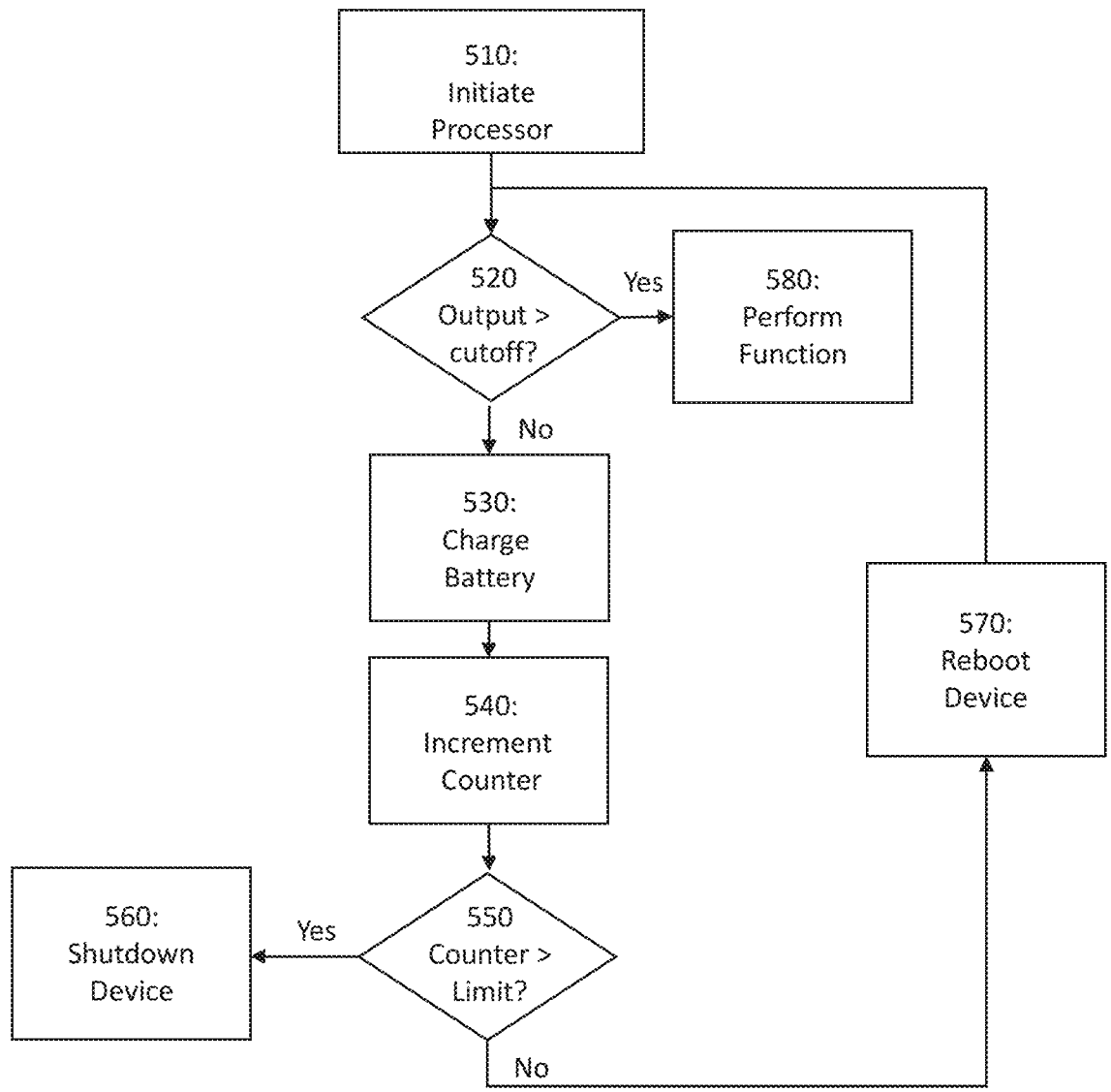
FIG. 5 shows another method 500 for detection of a deeply discharged rechargeable battery in an electronic device according to another exemplary embodiment of the present disclosure.

Turning now to FIG. 5, another method 500 for detection of a deeply discharged rechargeable battery in an electronic device according to an exemplary embodiment of the present disclosure is shown. The method is first operative to initiate 510 a processor operative to perform a function within a battery-operated device. In an exemplary embodiment, the battery-operated device may receive a video signal from a camera and convert this video signal to a data signal suitable for transmission on a wireless network. The battery-operated device may then transmit the data signal via the wireless network.

The method is next operative to compare 520 a first output voltage of the battery with a cutoff voltage. If the first output voltage is greater than the cutoff voltage, the method is then operative to perform 580 the function such as converting the video signal. If the first output voltage is less than the cutoff voltage, the method is operative to charge 530 the battery with a charging circuitry for a duration of time between three and seven seconds in response to the first output voltage being less than a cutoff voltage. In an exemplary application, the battery is charged for five seconds. The duration of the charge may be selected to provide some charge to the battery while avoiding overheating or otherwise damaging the battery. The battery charging duration may be any amount of time determined in response to design criteria, battery capacity, and or/power supply rating and is not limited to the range of three to seven seconds.

The method is next operative to increment 540 a counter indicative of the number of short recharge durations applied to the battery. The method then compares the counter to a counter limit 550 to determine if the maximum number of short charge durations have been applied. If the counter limit is exceeded, the method is then operative to shutdown 560 the battery-operated device. If the counter limit has not been exceeded, the method is operative to reboot 570 the battery-operated device and to continue the method by comparing 520 a subsequent output voltage of the battery to the cutoff.

In addition to shutting down 560 the device in response to the counter limit being exceeded, the method may further provide a user prompt indicative of battery fault in response to the second output voltage being less than the cutoff voltage. The user prompt may be provided via a light emitting diode, a display screen or an audible alert.

The term "exemplary" is used herein to represent one example, instance or illustration that may have any number of alternates. Any implementation described herein as "exemplary" should not necessarily be construed as preferred or advantageous over other implementations. While several exemplary embodiments have been presented in the foregoing detailed description, it should be appreciated that a vast number of alternate but equivalent variations exist, and the examples presented herein are not intended to limit the scope, applicability, or configuration of the disclosure in any way. To the contrary, various changes may be made in the function and arrangement of the various features described herein without departing from the scope of the claims and their legal equivalents.

What is claimed is:

1. An automated process performed by a device that is powered by a battery, the automated process comprising:
   determining a first output voltage of the battery;
   charging the battery for a duration of time in response to the first output voltage being less than a cutoff voltage;
   rebooting the device;
   after the rebooting, determining a second output voltage of the battery;
   determining if the second output voltage is less than the cutoff voltage and, if so, providing a user prompt indicative of battery fault; and
   shutting down the battery-operated device.

2. The automated process of claim 1 further including determining a third output voltage of the battery and wherein the shutting down of the battery-operated device is performed in response to the third output voltage being less than a cutoff voltage.

3. The automated process of claim 1 wherein the cutoff voltage is zero volts and is indicative of the battery being disconnected by a cutoff circuitry in response to the battery being discharged below a lower voltage limit.

4. The automated process of claim 1 wherein the user prompt is provided via a light emitting diode.

5. The automated process of claim 1 wherein the battery is a lithium ion battery.

6. The automated process of claim 1 wherein the cutoff voltage is indicative of the battery being discharged below a lower voltage limit.

7. The automated process of claim 1 further including incrementing a counter in response to the first output voltage being less than a cutoff voltage.

8. The automated process of claim 1 wherein the user prompt is provided via an audible alert.

9. The automated process of claim 1 wherein the charging occurs for a duration less than ten seconds.

10. The automated process of claim 1 wherein the duration of time is between three and seven seconds.

11. The automated process of claim 1 wherein the duration of time is between four and six seconds.

12. A battery-operated device comprising:
    a battery having a voltage output;
    a charging circuit for charging the battery in response to a charging control signal;
    a processor configured to:
      perform a first measurement of the voltage output of the battery;
      control the charging circuit to charge the battery for a duration of time in response to the first measurement being less than a predetermined lower voltage limit;
      reboot the battery-operated device after controlling the charging circuit for the duration of time;
      perform a second measurement of the voltage output of the battery after the reboot; and
      if the second measurement of the voltage output is less than the predetermined lower voltage limit, generate a user prompt indicative of a battery fault and shut down the battery-operated device.

13. The battery-operated device of claim 12 wherein the battery is a lithium ion battery.

14. The battery-operated device of claim 12 wherein the processor is further operative to increment a counter in response to the first measurement of the battery voltage being less than the predetermined lower voltage limit.

15. The battery-operated device of claim 12 wherein the first determination is zero volts and is indicative of the battery disconnecting the voltage output in response to a charge level being below a lower voltage limit.

16. The battery-operated device of claim 12 further comprising a power supply for providing a supply voltage to the charging circuit, the processor, and a user interface.

17. The battery-operated device of claim 12 wherein the charging occurs for a duration less than ten seconds.

18. The battery-operated device of claim 12 wherein the charging occurs for a duration of three to seven seconds.

19. The battery-operated device of claim 12 wherein the charging occurs for a duration of four to six seconds.

\* \* \* \* \*